United States Patent
Tenno

(10) Patent No.: US 10,931,015 B2
(45) Date of Patent: Feb. 23, 2021

(54) ANTENNA UNIT AND ELECTRONIC DEVICE

(71) Applicant: Murata Manufacturing Co., Ltd., Nagaokakyo (JP)

(72) Inventor: Nobuyuki Tenno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 28 days.

(21) Appl. No.: 16/553,396

(22) Filed: Aug. 28, 2019

(65) Prior Publication Data

US 2019/0386394 A1 Dec. 19, 2019

Related U.S. Application Data

(63) Continuation of application No. PCT/JP2019/003934, filed on Feb. 5, 2019.

(30) Foreign Application Priority Data

Feb. 16, 2018 (JP) .................. 2018-025581

(51) Int. Cl.
*H01Q 1/22* (2006.01)
*H01Q 7/00* (2006.01)
(Continued)

(52) U.S. Cl.
CPC ......... *H01Q 7/00* (2013.01); *G06K 19/07775* (2013.01); *H01Q 1/2208* (2013.01);
(Continued)

(58) Field of Classification Search
CPC ....... G06K 19/07775; G06K 19/07779; H01Q 1/22; H01Q 1/2208; H01Q 1/2283;
(Continued)

(56) References Cited

U.S. PATENT DOCUMENTS

| | | | |
|---|---|---|---|
| 8,259,023 B2 * | 9/2012 | Kubo | H01Q 7/06 343/788 |
| 8,698,685 B2 * | 4/2014 | Ito | H01Q 7/08 343/788 |

(Continued)

FOREIGN PATENT DOCUMENTS

| | | |
|---|---|---|
| WO | 2009/011423 A1 | 1/2009 |
| WO | 2015/133503 A1 | 9/2015 |
| WO | 2017/057421 A1 | 4/2017 |

OTHER PUBLICATIONS

Official Communication issued in International Patent Application No. PCT/JP2019/003934, dated Apr. 23, 2019.

*Primary Examiner* — Tho G Phan
(74) *Attorney, Agent, or Firm* — Keating & Bennett, LLP

(57) ABSTRACT

An antenna unit includes a substrate, a body that includes a first conductive portion and a second conductive portion opposed to each other on side surfaces orthogonal or substantially orthogonal to a first main surface of the substrate, and first and second coil antennas the winding axes of which are orthogonal or substantially orthogonal to the first main surface. In a plan view of the first main surface, the first coil antenna is positioned in proximity to the first conductive portion, compared with the second coil antenna, and the second coil antenna is positioned in proximity to the second conductive portion, compared with the first coil antenna. In a plan view of the first main surface, a straight line passing through the first coil antenna and the second coil antenna intersects with the first conductive portion and the second conductive portion.

20 Claims, 9 Drawing Sheets

(51) Int. Cl.
  *G06K 19/077* (2006.01)
  *H01Q 1/48* (2006.01)
  *H05K 1/18* (2006.01)

(52) U.S. Cl.
  CPC ............... *H01Q 1/48* (2013.01); *H05K 1/181* (2013.01); *H05K 2201/10098* (2013.01)

(58) Field of Classification Search
  CPC .. H01Q 1/24; H01Q 1/38; H01Q 1/48; H01Q 7/00; H01Q 7/06; H01Q 7/08; H05K 1/165; H05K 1/181; H05K 2201/0715; H05K 2201/10015; H05K 2201/10037; H05K 2201/10098; H05K 2201/10371; H04B 5/02
  See application file for complete search history.

(56) References Cited

U.S. PATENT DOCUMENTS

| | | | | |
|---|---|---|---|---|
| 8,922,444 | B2* | 12/2014 | Yosui | H01Q 1/241 |
| | | | | 343/788 |
| 9,153,855 | B2* | 10/2015 | Yamaguchi | H01Q 11/105 |
| 9,692,128 | B2* | 6/2017 | Kato | H01Q 1/2208 |
| 10,290,934 | B2* | 5/2019 | Tomonari | H01Q 7/00 |
| 10,424,969 | B2* | 9/2019 | Peralta | H04B 5/0093 |
| 2010/0103058 | A1 | 4/2010 | Kato et al. | |
| 2016/0372817 | A1 | 12/2016 | Nakano | |
| 2017/0346163 | A1 | 11/2017 | Lee et al. | |

* cited by examiner

ANTENNA UNIT AND ELECTRONIC DEVICE

CROSS REFERENCE TO RELATED APPLICATIONS

This application claims the benefit of priority to Japanese Patent Application No. 2018-025581 filed on Feb. 16, 2018 and is a Continuation Application of PCT Application No. PCT/JP2019/003934 filed on Feb. 5, 2019. The entire contents of each application are hereby incorporated herein by reference.

BACKGROUND OF THE INVENTION

1. Field of the Invention

The present invention relates to an antenna unit used in, for example, a radio-frequency identification (RFID) system or a near field wireless communication system, and an electronic device including the antenna unit.

2. Description of the Related Art

International Publication No. 2017/057421 discloses an antenna unit that suppresses an occurrence of many magnetic fluxes that do not have interlinkage to a coil antenna of a communication partner side, that is, many magnetic fluxes that do not contribute to communication, among magnetic fluxes passing through the coil opening of the coil antenna, to increase a coupling coefficient with the coil antenna at the communication partner side, thus improving communication characteristics.

With the antenna unit described in International Publication No. 2017/057421, arranging an antenna (a ferrite chip antenna) having a structure in which a coil is wound around magnetic ferrite in proximity to a metal body enables unnecessary magnetic fluxes that do not have interlinkage to the communication partner antenna to be decreased to improve the degree of coupling with the communication partner antenna.

Although the center of gain distribution (hot spot) of the antenna is generally positioned immediately above the antenna, there are cases in actual use in which the center of the gain distribution of the antenna is desired to be positioned almost immediately above the metal body. However, when the metal body is arranged in proximity to the antenna, it may be difficult to position the hot spot almost immediately above the metal body.

SUMMARY OF THE INVENTION

Preferred embodiments of the present invention provide antenna units that are each capable of positioning the hot spot almost immediately above the metal body and electronic devices including the antenna units.

An antenna unit according to a preferred embodiment of the present invention includes a substrate including a first main surface, a body that is provided on the first main surface and that includes a first conductive portion and a second conductive portion that are opposed to each other on side surfaces orthogonal or substantially orthogonal to the first main surface, a first coil antenna that is provided on the first main surface and the winding axis of which is orthogonal or substantially orthogonal to the first main surface, and a second coil antenna that is provided on the first main surface and the winding axis of which is orthogonal or substantially orthogonal to the first main surface. In a plan view of the first main surface, the first coil antenna is positioned in proximity to the first conductive portion, compared with the second coil antenna. In a plan view of the first main surface, the second coil antenna is positioned in proximity to the second conductive portion, compared with the first coil antenna. The first coil antenna and the second coil antenna are electrically connected so as to produce magnetic fluxes that are in phase with each other in a plan view of the first main surface. In a plan view of the first main surface, a straight line passing through the first coil antenna and the second coil antenna intersects with the first conductive portion and the second conductive portion.

With the above configuration, the magnetic fluxes passing through the coil opening of the first coil antenna are induced in a direction vertical to the first main surface in the first conductive portion and the magnetic fluxes passing through the coil opening of the second coil antenna are induced in the direction vertical to the first main surface in the second conductive portion. Since the magnetic fluxes are in phase with each other, the magnetic fluxes in the direction vertical to the first main surface at an intermediate position between the first conductive portion and the second conductive portion (an intermediate position between the first coil and the second coil) are increased at a position in height which is not immediately above the first coil and not immediately above the second coil, but is slightly spaced apart from the first coil and the second coil. Accordingly, it is possible to provide the antenna unit in which the hot spot is positioned at the intermediate position between the first conductive portion and the second conductive portion, that is, almost immediately above the metal body including the first conductive portion and the second conductive portion.

In an antenna unit according to a preferred embodiment of the present invention, it is preferable that, in a perpendicular or substantially perpendicular direction of the first main surface, the length of the first conductive portion is greater than the length of the first coil antenna along the first conductive portion and that, in the perpendicular or substantially perpendicular direction of the first main surface, the length of the second conductive portion is greater than the length of the second coil antenna along the second conductive portion. With this structure, the induction effect of the magnetic fluxes due to the first conductive portion and the second conductive portion is improved. Accordingly, the antenna unit having high radiation efficiency is provided.

In an antenna unit according to a preferred embodiment of the present invention, the widthwise length of the first conductive portion is greater than the widthwise length of the first coil antenna along the first conductive portion in a direction that is parallel or substantially parallel to the first main surface and that is parallel or substantially parallel to the side surface of the first conductive portion, and the widthwise length of the second conductive portion is greater than the widthwise length of the second coil antenna along the second conductive portion in a direction that is parallel or substantially parallel to the first main surface and that is parallel or substantially parallel to the side surface of the second conductive portion. With this structure, the induction effect of the magnetic fluxes due to the first conductive portion and the second conductive portion is more effective to provide the antenna unit having high radiation efficiency.

In an antenna unit according to a preferred embodiment of the present invention, it is preferable that a planar conductor that includes a surface parallel or substantially parallel to the first main surface is provided on the first main surface, that the planar conductor includes a first aperture, a second aperture, a first slit with which the first aperture is linked to an outer edge of the planar conductor, and a second slit with which the second aperture is linked to the outer edge of the planar conductor, and that, in a plan view of the first main surface, the first coil antenna overlaps with the first aperture and the second coil antenna be overlaps with the second aperture. With this structure, current is induced in the planar conductor, and the planar conductor contributes to radiation as the antenna. Accordingly, the antenna unit having high radiation efficiency is provided.

An antenna unit according to a preferred embodiment of the present invention includes a first capacitor that crosses over the first slit and a second capacitor that crosses over the second slit. With this structure, the inductance occurring at the first aperture and the first capacitor define a resonant circuit and the inductance occurring at the second aperture and the second capacitor define a resonant circuit to increase the Q values of the first coil antenna and the second coil antenna.

In a plan view of the first main surface, a line passing through the winding center of the coil of the first coil antenna and the winding center of the coil of the second coil antenna preferably passes through a circle, the center of which is the centroid of the planer shape of the body and which has a radius of about ¼ of a length in a direction that is parallel or substantially parallel to the first main surface and that is parallel or substantially parallel to the side surface of the first conductive portion or the second conductive portion. According to this structure, the first conductive portion and the second conductive portion, which are sufficiently wide, are disposed between the first coil and the second coil to improve the induction effect of the magnetic fluxes due to the first conductive portion and the second conductive portion. Accordingly, the antenna unit having high radiation efficiency is provided.

An electronic device according to a preferred embodiment of the present invention includes an antenna unit and a feed circuit connected to the antenna unit. The antenna unit includes a substrate including a first main surface, a body that is provided on the first main surface and that includes a first conductive portion and a second conductive portion that are opposed to each other on side surfaces orthogonal or substantially orthogonal to the first main surface, a first coil antenna which is mounted on the first main surface and the winding axis of which is orthogonal or substantially orthogonal to the first main surface, and a second coil antenna which is mounted on the first main surface and the winding axis of which is orthogonal or substantially orthogonal to the first main surface. In a plan view of the first main surface, the first coil antenna is positioned in proximity to the first conductive portion, compared with the second coil antenna. In a plan view of the first main surface, the second coil antenna is positioned in proximity to the second conductive portion, compared with the first coil antenna. In addition, the first coil antenna and the second coil antenna are electrically connected so as to produce magnetic fluxes that are in phase with each other in a plan view of the first main surface. In a plan view of the first main surface, a straight line passing through the first coil antenna and the second coil antenna intersects with the first conductive portion and the second conductive portion.

With the above configuration, it is possible to provide the electronic device including the antenna unit having the hot spot almost immediately above the metal body.

According to preferred embodiments of the present invention, antenna units each having the hot spot almost immediately above the metal body and electronic devices including the antenna units are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

In preferred embodiments described below, an antenna coil provided in a composite antenna element is an antenna that emits magnetic fluxes. This antenna is used for neighborhood communication that uses magnetic field coupling with a communication partner antenna and is preferably used in communication, such as near field communication (NFC) or radio-frequency identification (RFID), for example. The antenna is preferably used in the communication in, for example, a high-frequency (HF) band, particularly, at a frequency of about 13.56 MHz or at frequencies near 13.56 MHz. The size of the antenna coil is sufficiently smaller than a wavelength λ at the frequency that is used. The extended length of a conductor pattern of the antenna coil indicated in each preferred embodiment is preferably smaller than or equal to about λ/10, for example. The wavelength here means the effective wavelength that takes into consideration the wavelength shortening effect due to dielectricity or permeability of a base material on which the antenna is provided. Both ends of the antenna coil are connected to a feed circuit that operates in a used frequency band (the HF band, particularly, a frequency band near 13.56 MHz, for example). Accordingly, current having a uniform or substantially uniform magnitude along the conductor pattern, that is, in a current flowing direction, flows through the antenna coil and the antenna coil does not have current distribution along the conductor pattern as in a case in which the length of the conductor pattern of the antenna coil is smaller than or equal to the wavelength.

First Preferred Embodiment

Figure 1:
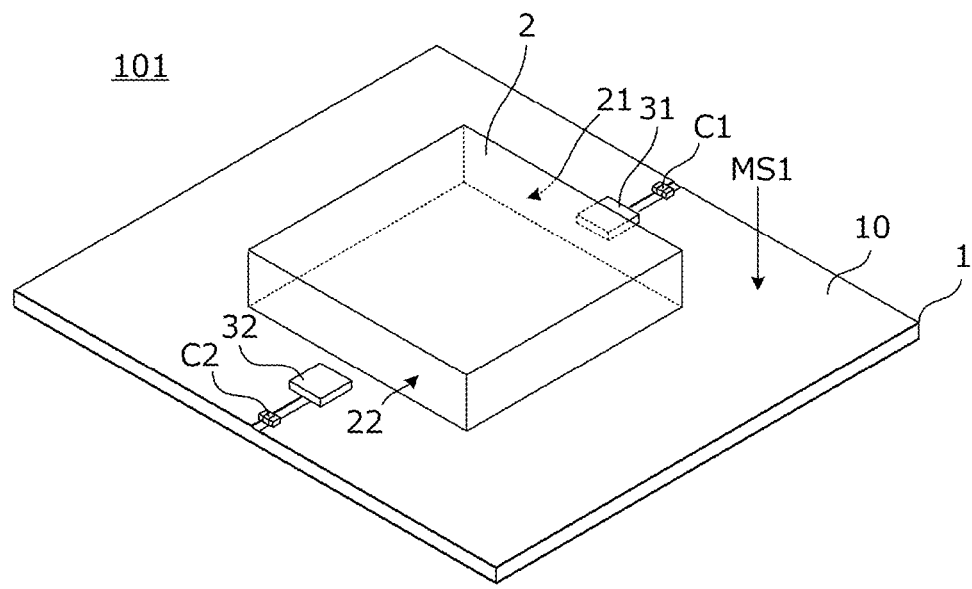
FIG. 1 is a perspective view of an antenna unit 101 according to a first preferred embodiment of the present invention.

FIG. 1 is a perspective view of an antenna unit 101 according to a first preferred embodiment of the present invention. The antenna unit 101 is provided in an electronic device. The electronic device may be various electronic devices including, for example, a mobile phone terminal, such as a smart phone or a feature phone, a wearable terminal, such as a smart watch or a smart glass, a mobile personal computer (PC), such as a notebook PC or a tablet PC, an information device, such as a camera, a game machine, or a toy, and an information medium, such as an integrated circuit (IC) tag, a secure digital (SD) card, a subscriber identity module (SIM) card, or an IC card.

Figure 2:
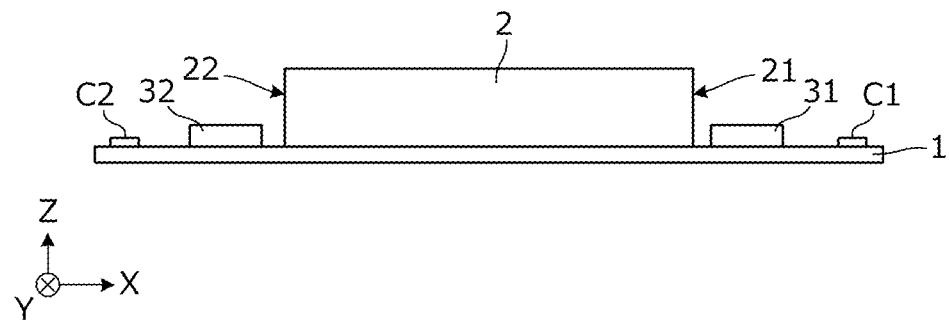
FIG. 2 is a front view of the antenna unit 101.

FIG. 2 is a front view of the antenna unit 101. The antenna unit 101 includes a substrate 1, a body 2 that is provided on the substrate 1 and may preferably be a metal body, a first coil antenna 31, a second coil antenna 32, and capacitors C1 and C2. In addition, in the present preferred embodiment, the body 2, the first coil antenna 31, the second coil antenna 32, and the capacitors C1 and C2 are mounted on the substrate 1.

The substrate 1 includes a first main surface MS1 and the body 2 is provided on the first main surface MS1 of the substrate 1. The body 2 includes a first conductive portion 21 and a second conductive portion 22 on side surfaces orthogonal or substantially orthogonal to the first main surface MS1. The first conductive portion 21 is opposed to the second conductive portion 22. The body 2 is preferably, for example, a functional component of any kind, such as a metal mechanism component, a shield case, or a battery. The antenna unit 101 of the present preferred embodiment uses a portion of the body 2, which is the functional component. Although all of the four side surfaces of the body 2 may be conductive portions or the entire outer surface thereof may be a conductive portion, the first conductive portion 21 and the second conductive portion 22, which are opposed to each other, are particularly used in the present preferred embodiment.

In a plan view of the first main surface MS1, the first coil antenna 31 is positioned in proximity to the first conductive portion 21, compared with the second coil antenna 32. The second coil antenna 32 is proximity to the second conductive portion 22, compared with the first coil antenna 31.

Each of the first coil antenna 31 and the second coil antenna 32 is a component in which a rectangular or substantially rectangular loop coil, a rectangular or substantially rectangular helical coil, or a rectangular or substantially rectangular spiral coil, the winding axis of which is orthogonal or substantially orthogonal to the first main surface MS1, is provided in a multilayer body of insulating base material layers preferably made of, for example, magnetic ferrite. A coil conductor of each of the first coil antenna 31 and the second coil antenna 32 may be a two-dimensionally extended coil conductor, such as one in which the coil conductor is wound around the winding axis multiple times in a spiral shape on one plane, or may be a three-dimensionally extended coil conductor, such as one in which the coil conductor is wound around the winding axis multiple times in a helical shape along the winding axis.

Figure 3A:
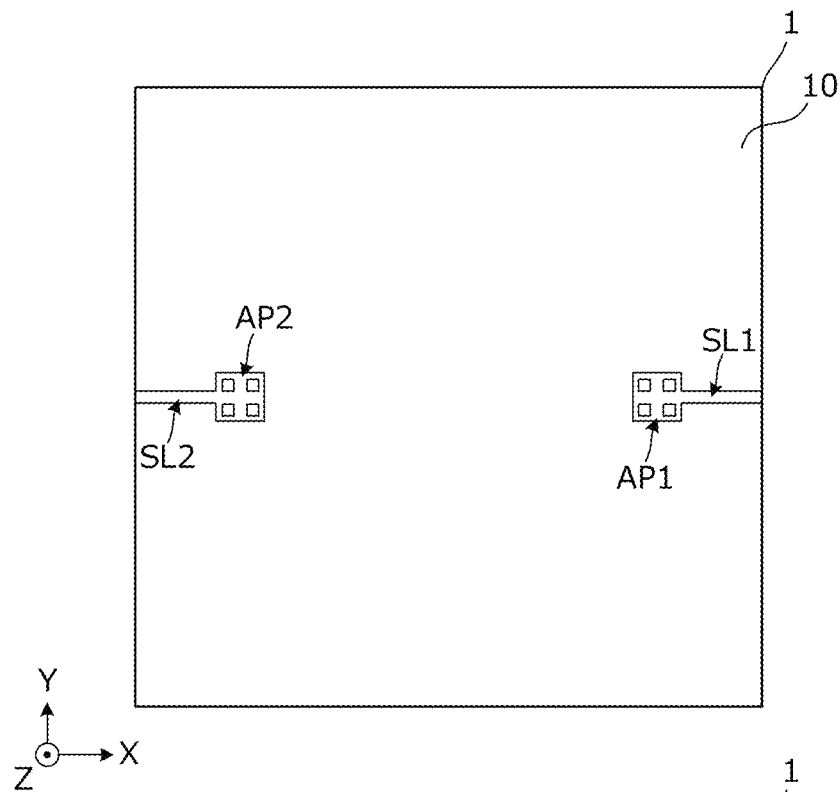
FIG. 3A is a plan view indicating the pattern of a planar conductor provided on a first main surface of a substrate 1 and FIG. 3B is a plan view of the antenna unit 101.
Figure 3B:
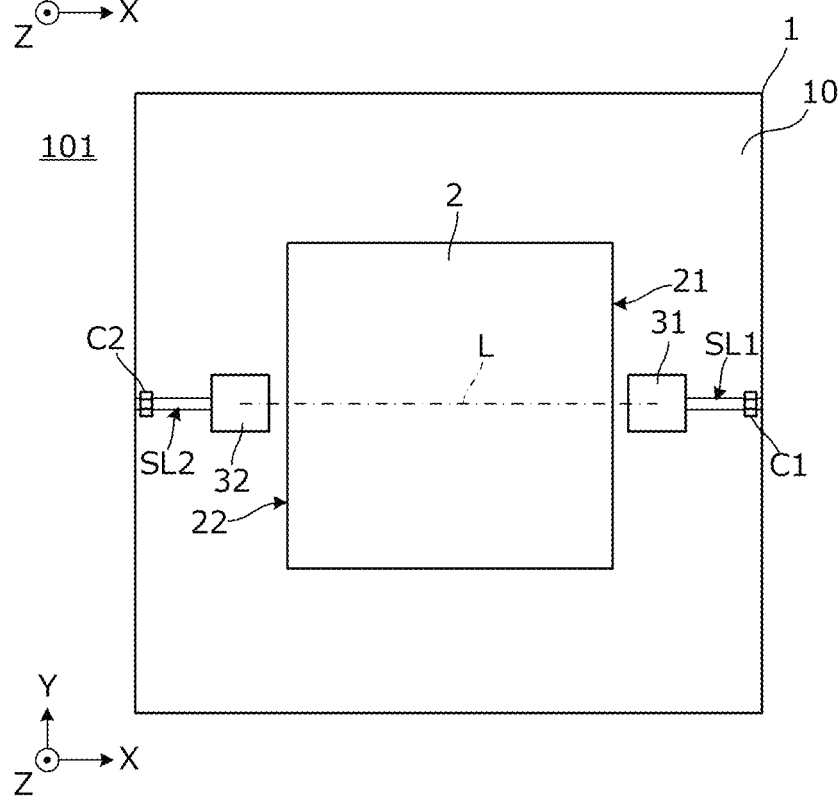

FIG. 3A is a plan view indicating the pattern of a planar conductor provided on the first main surface of the substrate 1. FIG. 3B is a plan view of the antenna unit 101.

The substrate 1 is preferably, for example, a circuit board on which multiple electronic components other than the components of the antenna unit are mounted and includes a conductor that extends in a planar shape and that is provided on the first main surface MS1. The planar conductor is preferably, for example, a copper foil disposed on an insulating base material. The planar conductor may be a planar ground conductor or the like provided in the substrate 1. A first aperture AP1, a second aperture AP2, a first slit SL1, and a second slit SL2 are provided in a planar conductor 10. The first aperture AP1 is linked to the outer edge of the planar conductor 10 by the first slit SL1. The second aperture AP2 is linked to the outer edge thereof by the second slit SL2. Four pad electrodes are respectively provided in the first aperture AP1 and the second aperture AP2. Four terminal electrodes are respectively provided on the bottom surfaces of the first coil antenna 31 and the second coil antenna 32 and are connected to the pad electrodes. Among the four terminal electrodes of each of the first coil antenna 31 and the second coil antenna 32, two terminal electrodes are connected to a feed circuit provided in the substrate 1 via interlayer connection conductors. The remaining two terminal electrodes are dummy terminal electrodes to facilitate mounting. As described below, the first coil antenna 31 and the second coil antenna 32 are connected to the feed circuit so as to produce the magnetic fluxes that are in phase with each other in a plan view of the first main surface MS1.

The capacitors C1 and C2 are preferably chip capacitors, for example. The capacitor C1 is connected so as to cross over the first slit SL1. The capacitor C2 is connected so as to cross over the second slit SL2.

In a plan view of the first main surface MS1, a straight line passing through the first coil antenna 31 and the second coil antenna 32 intersects with the first conductive portion 21 and the second conductive portion 22. In the present preferred embodiment, as illustrated by an alternate long and short dash line in FIG. 3B, a straight line L passing through the center of the first coil antenna 31 and the center of the second coil antenna 32 is orthogonal or substantially orthogonal to the surface of the first conductive portion 21 and the surface of the second conductive portion 22.

Figure 4:
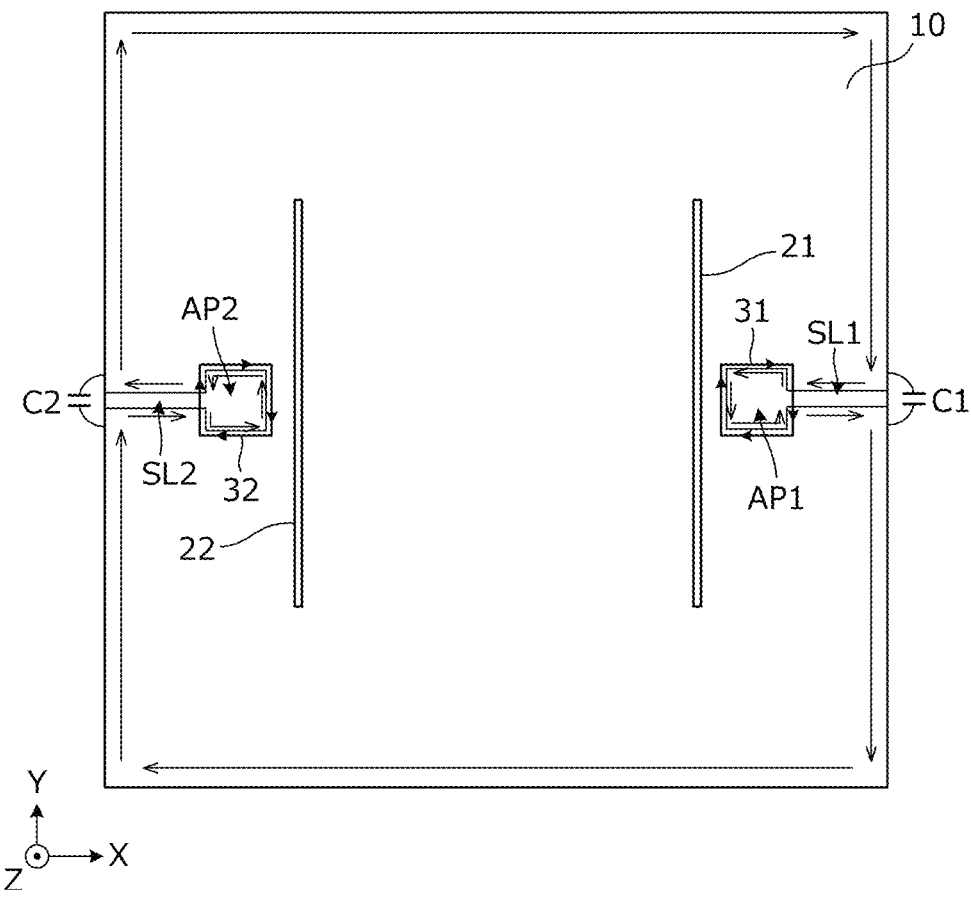
FIG. 4 is a diagram schematically illustrating current flowing through a first coil antenna 31, a second coil antenna 32, and a planar conductor 10.

FIG. 4 is a diagram schematically illustrating current flowing through the first coil antenna 31, the second coil antenna 32, and the planar conductor 10.

Since the first coil antenna 31 and the second coil antenna 32 are connected to produce the magnetic fluxes that are in phase with each other in a plan view of the first main surface MS1, clockwise current also flows through the second coil antenna 32 when clockwise current flows through the first coil antenna 31. At this phase, counterclockwise current flows along the outer perimeter of the first aperture AP1 (the inner perimeter of the planar conductor 10) at the position where the first coil antenna 31 is mounted and counterclockwise current flows along the outer perimeter of the second aperture AP2 (the inner perimeter of the planar conductor 10) at the position where the second coil antenna 32 is mounted. In addition, in conjunction with this, clockwise current flows mainly along the outer perimeters of the slits SL1 and SL2 and the planar conductor 10.

The first coil antenna 31 and the second coil antenna 32 are coupled to the planar conductor 10 in the above manner to cause the planar conductor 10 to function as a conductor contributing to the radiation. Since the planar conductor 10 has an area broader than those of the first coil antenna 31 and the second coil antenna 32, higher radiation efficiency is achieved, compared with a case in which only the first coil antenna 31 and the second coil antenna 32 are used.

Figure 5:
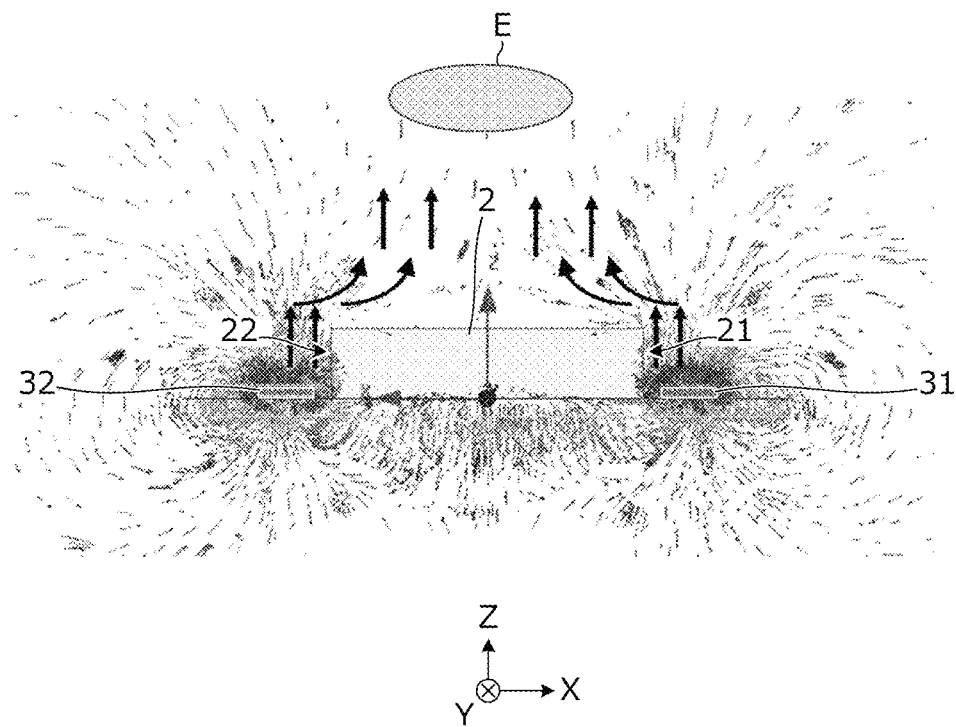
FIG. 5 is a diagram illustrating the function and effect of, particularly, a first conductive portion 21 and a second conductive portion 22 and is a magnetic flux density vector diagram illustrating the distribution of the densities of magnetic fluxes produced from the first coil antenna 31 and the second coil antenna 32.

FIG. 5 is a diagram illustrating the function and effect of, particularly, the first conductive portion 21 and the second conductive portion 22 and is a magnetic flux density vector diagram illustrating the distribution of the densities of the magnetic fluxes produced from the first coil antenna 31 and the second coil antenna 32. As illustrated by bold arrows in FIG. 5, the magnetic fluxes produced from the first coil antenna 31 are distributed so as to flow along the surface of the first conductive portion 21, to run over the first conductive portion 21, and to be induced toward the center of the body 2. Similarly, the magnetic fluxes produced from the second coil antenna 32 are distributed so as to flow along the surface of the second conductive portion 22, to run over the second conductive portion 22, and to be induced toward the center of the body 2. Accordingly, in a plan view, the hot spot is disposed at the center or approximate center of the body 2. An ellipse E in FIG. 5 schematically illustrates the position of the hot spot. Here, in the perpendicular or substantially perpendicular direction of the first main surface MS1, the length of the first conductive portion 21 is preferably greater than the length of the first coil antenna 31 along the first conductive portion 21. With this structure, most of the magnetic fluxes produced from the first coil antenna 31 flows along the surface of the first conductive portion 21 to improve the induction effect of the magnetic fluxes. In addition, in a direction that is parallel or substantially parallel to the first main surface MS1 and that is parallel or substantially parallel to the side surface including the first conductive portion 21, the length of the first conductive portion 21 is more preferably greater than the widthwise length of the first coil antenna 31 along the first conductive portion 21. With this structure, most of the magnetic fluxes produced from the first coil antenna 31 flows along the surface of the first conductive portion 21 to improve the induction effect of the magnetic fluxes. The same or substantially the same advantageous functions and effects are achieved also in the relationship between the width of the second coil antenna 32 and the length of the second conductive portion 22.

The position of the hot spot may be referred to as an intermediate position between the first conductive portion 21 and the second conductive portion 22 and an intermediate position between the first coil antenna 31 and the second coil antenna 32.

Figure 6:
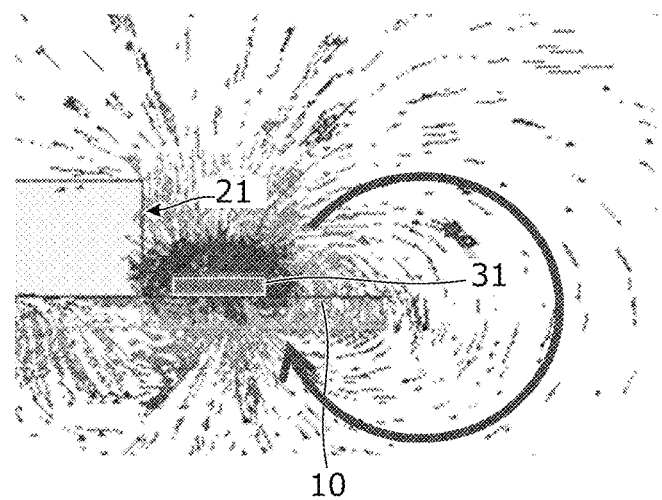
FIG. 6 is a diagram illustrating how the magnetic fluxes flow around, particularly, the end edge of the planar conductor 10.

FIG. 6 is a diagram illustrating how the magnetic fluxes flow around, particularly, the end edge of the planar conductor 10. As represented in FIG. 6, the magnetic fluxes that are produced from the first coil antenna 31 and that flow around the end edge of the planar conductor 10 are the magnetic fluxes that contribute to the coupling between the first coil antenna 31 and the planar conductor 10. Among the magnetic fluxes produced from the first coil antenna 31, the magnetic fluxes toward the center of the planar conductor 10 are practically blocked by the first conductive portion 21. Accordingly, the presence of the first conductive portion 21 increases the magnetic fluxes that are produced from the first coil antenna 31 and that flow around the end edge of the planar conductor 10. Then, interlinkage of the magnetic fluxes flowing around the end edge of the planar conductor 10 to the first slit SL1 or the first aperture AP1 occurs to increase the coupling between the first coil antenna 31 and the planar conductor 10. In other words, the first conductive portion 21 also effectively contributes to the coupling between the first coil antenna 31 and the planar conductor 10.

The same or substantially the same advantageous functions and effects are achieved in the relationship between the second coil antenna 32 and the second conductive portion 22.

Figure 7:
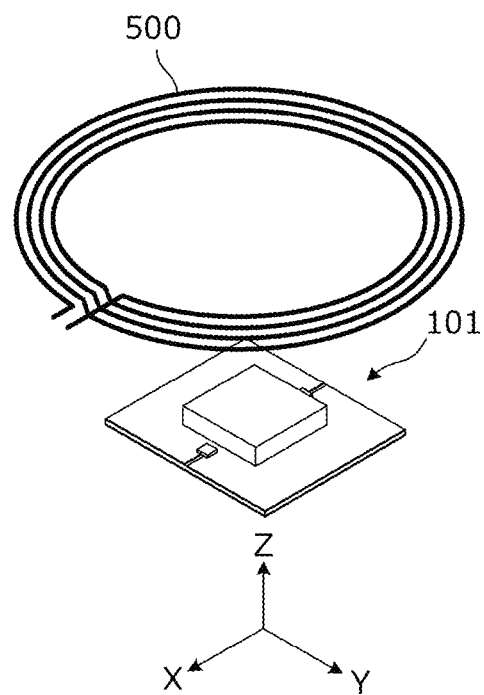
FIG. 7 is a perspective view illustrating the positional relationship between the antenna unit 101 and a communication partner antenna 500.

FIG. 7 is a perspective view illustrating the positional relationship between the antenna unit 101 and a communication partner antenna 500. In the present preferred embodiment, the spacing between the first coil antenna 31 and the second coil antenna 32 in the antenna unit 101 is preferably about 36 mm, for example, and the diameter of the communication partner antenna 500 is preferably about 70 mm, for example.

The communication partner antenna 500 is a coil-shaped antenna in which the coil is wound multiple turns in a plane.

Figure 8A:
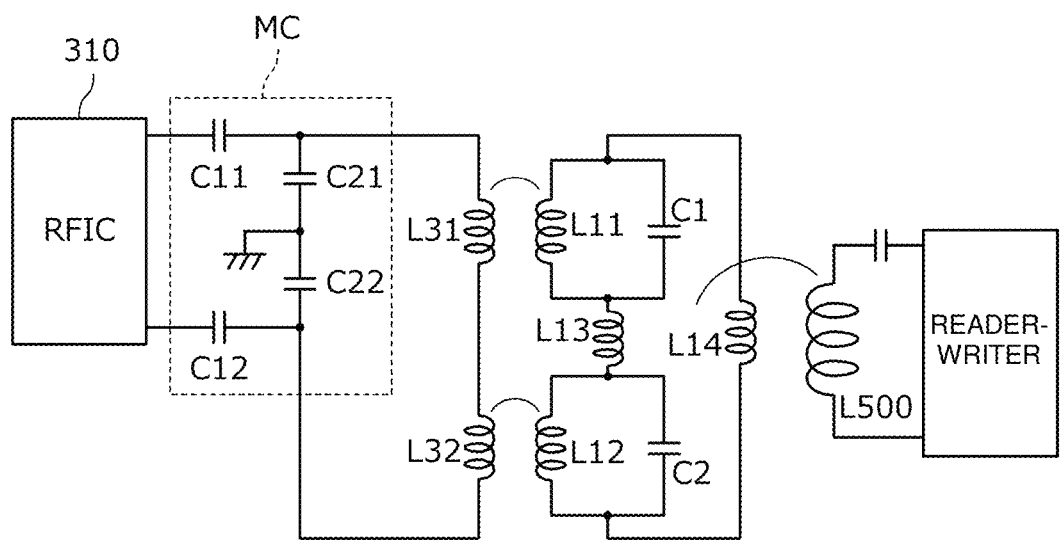
FIGS. 8A and 8B are circuit diagrams of circuits of the antenna unit 101 and the communication partner antenna 500 coupled to the antenna unit 101.
Figure 8B:
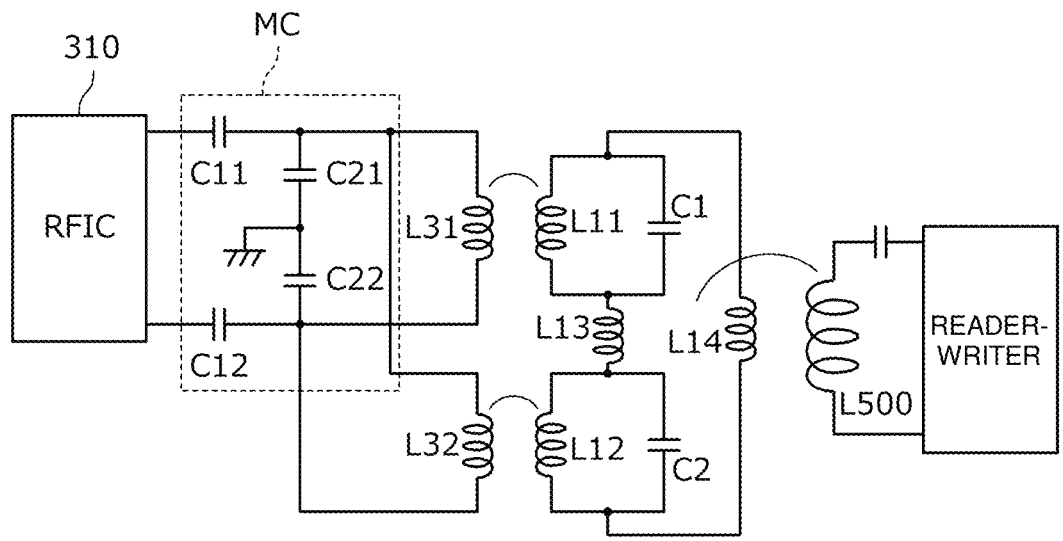

FIGS. 8A and 8B are circuit diagrams of circuits of the antenna unit 101 and the communication partner antenna 500 coupled to the antenna unit 101. In FIGS. 8A and 8B, an inductor L31 is a component representing the first coil antenna 31 using a circuit symbol and an inductor L32 is a component representing the second coil antenna 32 using a circuit symbol. FIG. 8A indicates an example in which the first coil antenna 31 is connected in series to the second coil antenna 32 and FIG. 8B indicates an example in which the first coil antenna 31 is connected in parallel to the second coil antenna 32.

Referring to FIGS. 8A and 8B, an inductor L11 is an inductance component occurring mainly at the first aperture AP1 of the planar conductor 10 and an inductor L12 is an inductance component occurring mainly at the second aperture AP2 of the planar conductor 10. The inductor L11 and the capacitor C1 define a resonant circuit and the inductor L12 and the capacitor C2 define a resonant circuit. Inductors L13 and L14 are inductance components caused by the path of current flowing mainly along the outer perimeter of the planar conductor 10.

An impedance matching circuit MC is connected between a radio-frequency integrated circuit (RFIC) 310, which is a feed circuit, and the first coil antenna 31 (the inductor L31) and the second coil antenna 32 (the inductor L32).

An inductor L500 is a component representing the communication partner antenna 500 using the circuit symbol of an inductor. The first coil antenna 31, the second coil antenna 32, and the inductors L13 and L14 are magnetically coupled to the communication partner antenna 500 (the inductor L500).

The resonant frequencies of the resonant circuits are in a communication frequency band or near the communication frequency band. For example, the resonant frequencies of the resonant circuits are in an HF band, such as a 13.56-MHz band. Since the dissipation factor is low in the HF band even if the magnetic layers of the coil antennas 31 and 32 are made of magnetic ferrite, the effect of improving the Q values of the coil antennas due to the magnetic layers is high.

The impedance matching circuit MC includes capacitors C11 and C12 connected in series to a signal line and capacitors C21 and C22 shunt-connected to ground.

Figure 9:
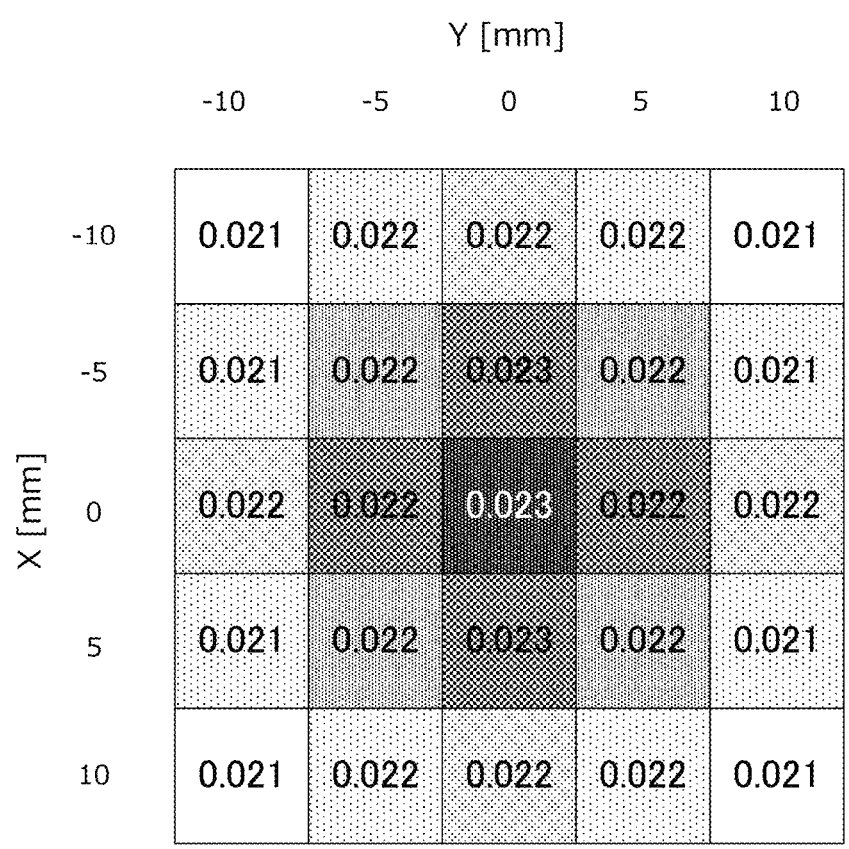
FIG. 9 is a diagram illustrating the distribution of coupling coefficients between the antenna unit 101 and the communication partner antenna.

FIG. 9 is a diagram illustrating the distribution of coupling coefficients between the antenna unit 101 of the present preferred embodiment and the communication partner antenna. An X-Y coordinate in FIG. 9 indicates the position of the antenna unit 101 illustrated in FIG. 7 in a plan view. A center (X=0, Y=0) in the X-Y coordinate is the position where the center or approximate center of the antenna unit 101 illustrated in FIG. 7 (the intermediate point between the first coil antenna 31 and the second coil antenna 32) coincides with the center or approximate center of the communication partner antenna 500 in a plan view. In this positional relationship, the coupling coefficient between the antenna unit 101 and the communication partner antenna 500 has a maximum value of about 0.023. The coupling coefficient is decreased as the relative position between the antenna unit 101 and the communication partner antenna 500 is shifted to the X-axis direction or to the Y-axis direction. Here, the size of the body 2 is preferably about 18 mm×about 18 mm, for example, and the center of the antenna unit 101 coincides with the center of the body 2.

Figure 12:
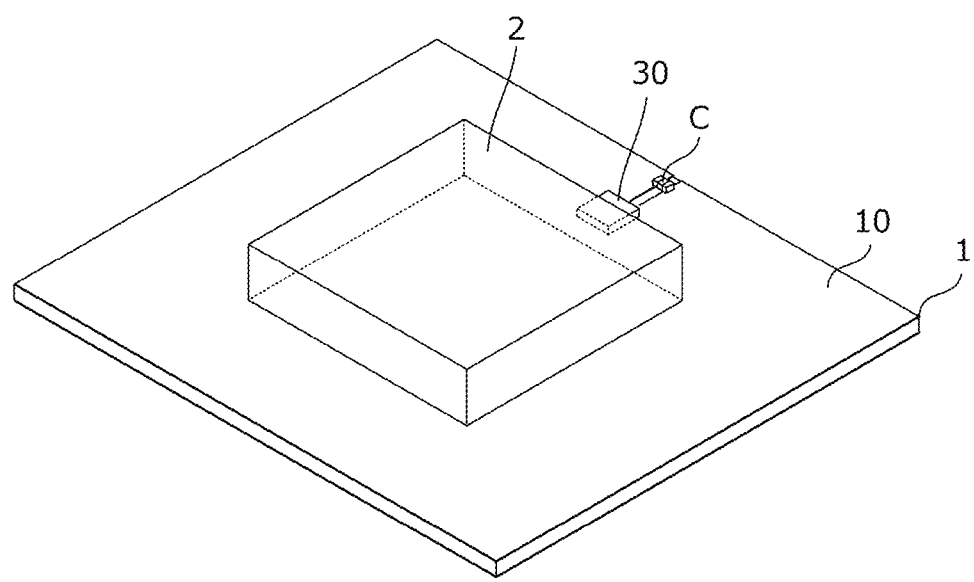
FIG. 12 is a perspective view of an antenna unit of a comparative example.
Figure 13:
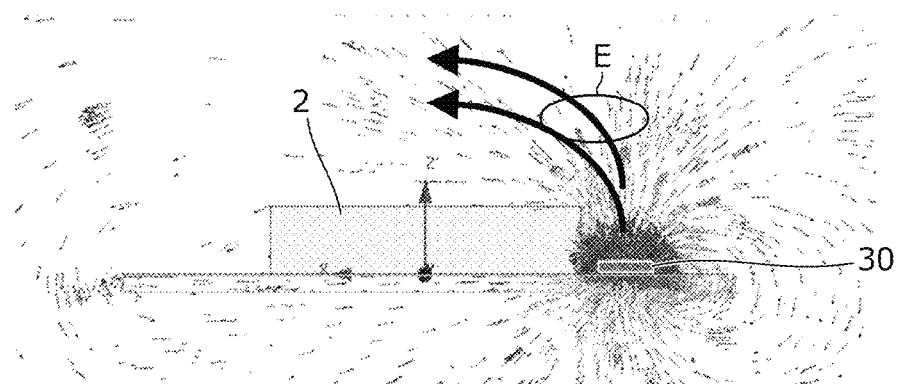
FIG. 13 is a diagram illustrating the function and effect of conductivity of side surfaces of a body 2 in the antenna unit of the comparative example and is a magnetic flux density vector diagram illustrating the distribution of the densities of magnetic fluxes produced from a coil antenna 30.
Figure 14:
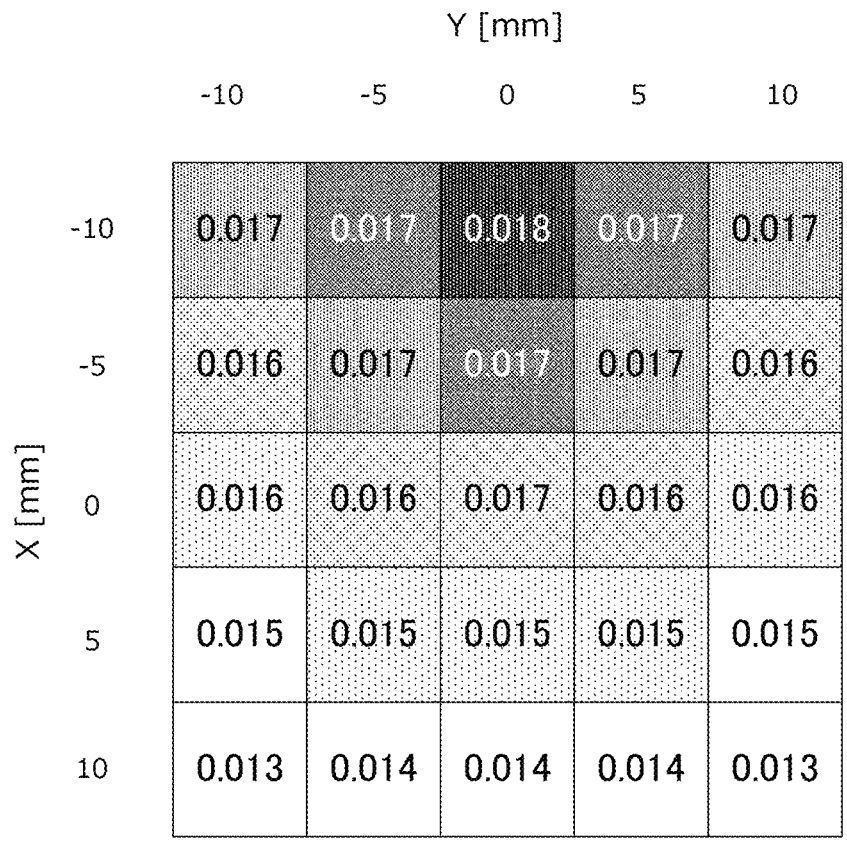
FIG. 14 is a diagram illustrating the distribution of the coupling coefficients between the antenna unit of the comparative example and the communication partner antenna.

An antenna unit of a comparative example and its characteristics will now be described. FIG. 12 is a perspective view of the antenna unit of the comparative example. FIG. 13 is a diagram illustrating the function and effect of conductivity of the side surfaces of the body 2 and is a magnetic flux density vector diagram illustrating the distribution of the densities of the magnetic fluxes produced from a coil antenna 30. FIG. 14 is a diagram illustrating the distribution of the coupling coefficients between the antenna unit of the comparative example and the communication partner antenna.

The antenna unit of the comparative example illustrated in FIG. 12 includes the substrate 1, the body 2 mounted on the substrate 1, the coil antenna 30, and a capacitor C. At least the side surfaces of the body 2 have the conductivity. The coil antenna 30 is provided at a position spaced apart from the center of the body 2 by about 10 mm.

In the antenna unit of the comparative example, the magnetic fluxes produced from the coil antenna 30 flow along the surface of the body 2, as illustrated by bold arrows in FIG. 13. Accordingly, in a plan view, the hot spot exists around the intermediate point between the coil antenna 30 and the body 2. The ellipse E in FIG. 13 schematically illustrates the position of the hot spot.

Referring to FIG. 14, the X-Y coordinate is the same as that illustrated in FIG. 9. In the case of the antenna of the comparative example, the coupling coefficient between the antenna unit and the communication partner antenna has a maximum value of about 0.018 at a position of X=−10 mm and Y=0 mm. The coupling coefficient is decreased as the relative position between the antenna unit and the communication partner antenna is shifted from this position to the X-axis direction or to the Y-axis direction.

As represented in FIG. 13 and FIG. 14, in the antenna of the comparative example, the hot spot exists at a position that is not almost immediately above the body 2 and that is close to the position of the coil antenna. In contrast, in the antenna unit 101 of the present preferred embodiment, the hot spot exists almost immediately above the body 2, as represented in FIG. 5 and FIG. 9.

Second Preferred Embodiment

Figure 10:
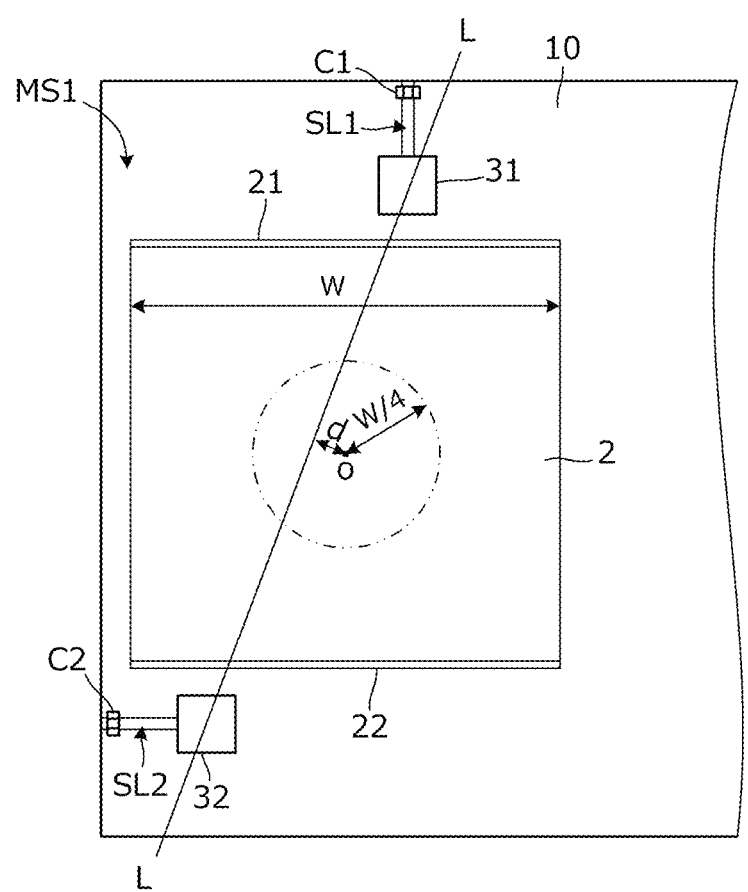
FIG. 10 is a plan view of an antenna unit according to a second preferred embodiment of the present invention.

FIG. 10 is a plan view of an antenna unit according to a second preferred embodiment of the present invention. The second preferred embodiment differs from the first preferred embodiment illustrated in FIG. 3B in the positions of the first coil antenna 31 and the second coil antenna 32.

Although the first coil antenna 31 is preferably provided at the center or approximate center in the width direction of the first conductive portion 21 and the second coil antenna 32 is preferably provided at the center or approximate center in the width direction of the second conductive portion 22, as described in the first preferred embodiment, a certain degree of freedom is provided to the relative positions between the coil antennas 31 and 32 and the conductive portions 21 and 22.

Referring to FIG. 10, a straight line L-L is a line passing through the winding center of the coil of the first coil antenna 31 and the winding center of the coil of the second coil antenna 32 and the first conductive portion 21 and the second conductive portion 22 are provided on side surfaces of the body 2. In a plan view of the first main surface MS1, the straight line L-L passing through the winding center of the coil of the first coil antenna 31 and the winding center of the coil of the second coil antenna 32 passes near a center O of the rectangular or substantially rectangular body 2. In the example illustrated in FIG. 10, the straight line L-L is spaced apart from the center O by a distance d. The straight line L-L preferably passes through a circle having a radius of about W/4 where the width of the body 2 is denoted by W. With this structure, it is possible to position the hot spot immediately above the body 2 and near the center of the body 2. According to this structure, the first conductive portion 21 and the second conductive portion 22, which are sufficiently wide, are disposed between the first coil antenna 31 and the second coil antenna 32 to improve the induction effect of the magnetic fluxes due to the first conductive portion 21 and the second conductive portion 22. Accordingly, the antenna unit having high radiation efficiency is provided. The width W of the body 2 indicates the length that is parallel or substantially parallel to the first main surface MS1 and that is along the side surfaces of the body 2.

Although the antenna units and the electronic devices in a communication system using the magnetic field coupling, such as NFC, for example, are mainly described in the above preferred embodiments, the antenna units and the electronic device in the above preferred embodiments are similarly applicable to a non-contact power transmission system (an electromagnetic induction method or a magnetic field resonance method) using the magnetic field coupling. For example, each of the antenna units in the above preferred embodiments is applicable as a power reception antenna unit in a power reception apparatus or a power transmission antenna unit in a power transmission apparatus in the non-contact power transmission system using the magnetic field resonance method, which is used in the HF band, particularly, at a frequency of about 6.78 MHz or at frequencies near 6.78 MHz, for example. In this case, both ends of the coil conductor of the coil antenna in the antenna unit are connected to a power reception circuit or a power transmission circuit, which operates in the used frequency band (the HF band, particularly, a frequency band near 6.78 MHz). Also in this case, the antenna unit defines and functions as the power reception antenna unit or the power transmission antenna unit. The power reception circuit preferably includes, for example, a rectification circuit, a smoothing circuit, a direct current-direct current (DC-DC) converter, and so on in order to supply electric power from a power reception coil antenna to a load (for example, a secondary battery) and these circuits are cascade-connected between the power reception coil antenna and the load. The power transmission circuit preferably includes, for example, a rectification circuit, a smoothing circuit, a switch circuit defining and functioning as a direct current-alternating-current (DC-AC) inverter, and so on in order to supply electric power from a commercial power supply to a power transmission coil antenna and these circuits are cascade-connected between the commercial power supply and the power transmission coil antenna.

Third Preferred Embodiment

Figure 11:
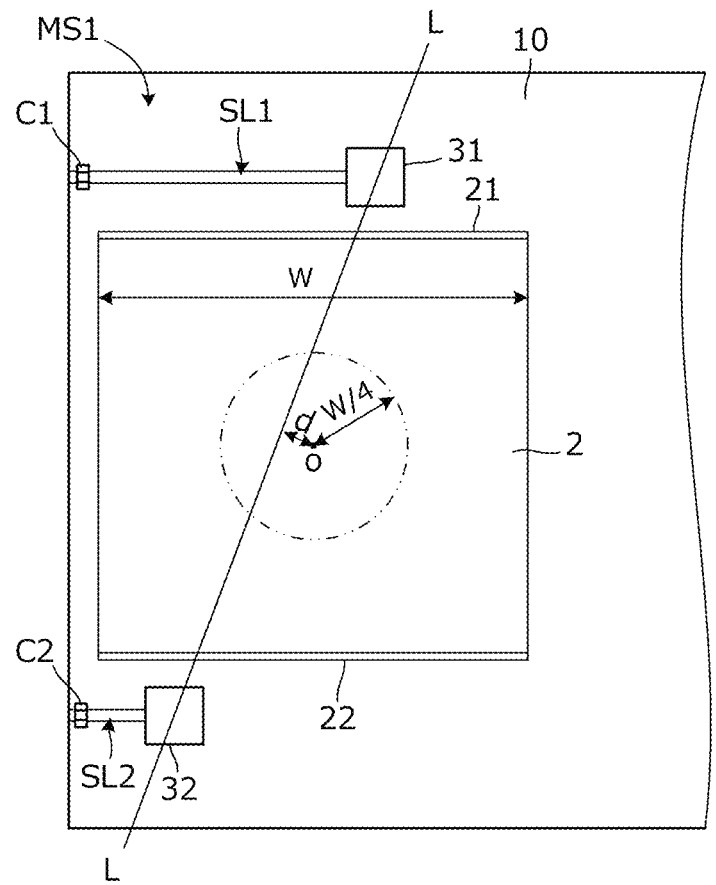
FIG. 11 is a plan view of an antenna unit according to a third preferred embodiment of the present invention.

FIG. 11 is a plan view of an antenna unit according to a third preferred embodiment of the present invention. The third preferred embodiment differs from the second preferred embodiment illustrated in FIG. 10 in the position of the first slit SL1 provided in the planar conductor 10.

As described in the second preferred embodiment, a certain degree of freedom is provided to the relative position between the coil antennas 31 and 32 and the conductive portions 21 and 22. In addition, a certain degree of freedom is provided to the slits that extend from the positions where the coil antennas 31 and 32 are mounted to the outer edge of the planar conductor 10. As illustrated in FIG. 11, both of the first slit SL1 and the second slit SL2 may be linked to the same side (the left side in the orientation illustrated in FIG. 11) of the planar conductor 10.

Finally, the description of the above preferred embodiments is for illustrative purposes only in all points and is not intended to be restrictive. Modifications and changes by persons skilled in the art may be appropriately made.

For example, electrical conduction may be achieved between the first conductive portion 21 and the second conductive portion 22, that is, the first conductive portion 21 and the second conductive portion 22 may be electrically continuous bodies.

In addition, the side surfaces themselves of the body 2 may be conductive or conductors may be provided at positions corresponding to the side surfaces.

Furthermore, the side surfaces of the body 2 are not limited to the flat surfaces and may be curved surfaces.

Furthermore, the planar shape of the body 2 is not limited to a square or a rectangle. In such a case, the center O of the circle illustrated in FIG. 10 is positioned at the centroid of the planar shape of the body 2. The body 2 may be include multiple components, instead of a single component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna unit comprising:
a substrate including a first main surface;
a body provided on the first main surface and including a first conductive portion and a second conductive portion that are opposed to each other on side surfaces orthogonal or substantially orthogonal to the first main surface;
a first coil antenna provided on the first main surface and a winding axis of which is orthogonal or substantially orthogonal to the first main surface; and
a second coil antenna provided on the first main surface and a winding axis of which is orthogonal or substantially orthogonal to the first main surface; wherein
in a plan view of the first main surface, the first coil antenna is in proximity to the first conductive portion, compared with the second coil antenna;
in the plan view of the first main surface, the second coil antenna is in proximity to the second conductive portion, compared with the first coil antenna;
the first coil antenna and the second coil antenna are electrically connected so as to produce magnetic fluxes that are in phase with each other in the plan view of the first main surface; and
in the plan view of the first main surface, a straight line passing through the first coil antenna and the second coil antenna intersects with the first conductive portion and the second conductive portion.

2. The antenna unit according to claim 1, wherein
a length of the first conductive portion is greater than a length of the first coil antenna along the first conductive portion in a perpendicular or substantially perpendicular direction of the first main surface; and
a length of the second conductive portion is greater than a length of the second coil antenna along the second conductive portion in the perpendicular or substantially perpendicular direction of the first main surface.

3. The antenna unit according to claim 1, wherein
a widthwise length of the first conductive portion is greater than a widthwise length of the first coil antenna along the first conductive portion in a direction parallel or substantially parallel to the first main surface and parallel or substantially parallel to a side surface of the first conductive portion; and
a widthwise length of the second conductive portion is greater than a widthwise length of the second coil antenna along the second conductive portion in a direction parallel or substantially parallel to the first main surface and parallel or substantially parallel to a side surface of the second conductive portion.

4. The antenna unit according to claim 1, wherein
the antenna unit includes a planar conductor provided on the first main surface and that includes a surface parallel or substantially parallel to the first main surface;
the planar conductor includes a first aperture, a second aperture, a first slit by which the first aperture is linked to an outer edge of the planar conductor, and a second slit by which the second aperture is linked to the outer edge of the planar conductor; and
in a plan view of the first main surface, the first coil antenna overlaps with the first aperture and the second coil antenna overlaps with the second aperture.

5. The antenna unit according to claim 4, wherein the antenna unit includes a first capacitor crossing over the first slit and a second capacitor crossing over the second slit.

6. The antenna unit according to claim 1, wherein, in a plan view of the first main surface, a line passing through a winding center of a coil of the first coil antenna and a winding center of a coil of the second coil antenna passes through a circle, a center of which is a centroid of a planer shape of the body and which has a radius of about ¼ of a length in a direction parallel or substantially parallel to the first main surface and parallel or substantially parallel to a side surface of the first conductive portion or the second conductive portion.

7. The antenna unit according to claim 1, wherein the body is one of a metal mechanism component, a shield case, or a battery.

8. The antenna unit according to claim 1, wherein all portions of the body are conductive.

9. The antenna unit according to claim 1, wherein each of the first and second coil antennas is one of a rectangular or substantially rectangular loop coil, a rectangular or substantially rectangular helical coil, or a rectangular or substantially rectangular spiral coil.

10. The antenna unit according to claim 1, wherein the substrate is a circuit board.

11. An electronic device comprising:
an antenna unit; and
a feed circuit connected to the antenna unit; wherein
the antenna unit includes:
a substrate including a first main surface;
a body provided on the first main surface and including a first conductive portion and a second conductive portion that are opposed to each other on side surfaces orthogonal or substantially orthogonal to the first main surface;
a first coil antenna mounted on the first main surface and a winding axis of which is orthogonal or substantially orthogonal to the first main surface; and
a second coil antenna mounted on the first main surface and a winding axis of which is orthogonal or substantially orthogonal to the first main surface;
in a plan view of the first main surface, the first coil antenna is positioned in proximity to the first conductive portion, compared with the second coil antenna;
in the plan view of the first main surface, the second coil antenna is in proximity to the second conductive portion, compared with the first coil antenna;
the first coil antenna and the second coil antenna are electrically connected so as to produce magnetic fluxes that are in phase with each other in the plan view of the first main surface; and
in the plan view of the first main surface, a straight line passing through the first coil antenna and the second coil antenna intersects with the first conductive portion and the second conductive portion.

12. The electronic device according to claim 11, wherein
a length of the first conductive portion is greater than a length of the first coil antenna along the first conductive portion in a perpendicular or substantially perpendicular direction of the first main surface; and
a length of the second conductive portion is greater than a length of the second coil antenna along the second conductive portion in the perpendicular or substantially perpendicular direction of the first main surface.

13. The electronic device according to claim 11, wherein
a widthwise length of the first conductive portion is greater than a widthwise length of the first coil antenna along the first conductive portion in a direction parallel or substantially parallel to the first main surface and parallel or substantially parallel to a side surface of the first conductive portion; and
a widthwise length of the second conductive portion is greater than a widthwise length of the second coil antenna along the second conductive portion in a direction parallel or substantially parallel to the first main surface and parallel or substantially parallel to a side surface of the second conductive portion.

14. The electronic device according to claim 11, wherein
the antenna unit includes a planar conductor provided on the first main surface and that includes a surface parallel or substantially parallel to the first main surface;
the planar conductor includes a first aperture, a second aperture, a first slit by which the first aperture is linked to an outer edge of the planar conductor, and a second slit by which the second aperture is linked to the outer edge of the planar conductor; and
in a plan view of the first main surface, the first coil antenna overlaps with the first aperture and the second coil antenna overlaps with the second aperture.

15. The electronic device according to claim 14, wherein the antenna unit includes a first capacitor crossing over the first slit and a second capacitor crossing over the second slit.

16. The electronic device according to claim 11, wherein, in a plan view of the first main surface, a line passing through a winding center of a coil of the first coil antenna and a winding center of a coil of the second coil antenna passes through a circle, a center of which is a centroid of a planer shape of the body and which has a radius of about ¼ of a length in a direction parallel or substantially parallel to the first main surface and parallel or substantially parallel to a side surface of the first conductive portion or the second conductive portion.

17. The electronic device according to claim 11, wherein the body is one of a metal mechanism component, a shield case, or a battery.

18. The electronic device according to claim 11, wherein all portions of the body are conductive.

19. The electronic device according to claim 11, wherein each of the first and second coil antennas is one of a rectangular or substantially rectangular loop coil, a rectangular or substantially rectangular helical coil, or a rectangular or substantially rectangular spiral coil.

20. The electronic device according to claim 11, wherein the substrate is a circuit board.

* * * * *